United States Patent [19]

Vittoz

[11] Patent Number: 4,580,106

[45] Date of Patent: Apr. 1, 1986

[54] DIFFERENTIAL AMPLIFIER WITH BIPOLAR TRANSISTORS WHICH IS COMPATIBLE WITH STANDARD COMPLIMENTARY MOS (CMOS) TECHNOLOGY

[75] Inventor: Eric A. Vittoz, Cernier, Switzerland

[73] Assignee: Centre Electronique Horloger S.A., Neuchatel, Switzerland

[21] Appl. No.: 588,373

[22] Filed: Mar. 12, 1984

[30] Foreign Application Priority Data

Mar. 18, 1983 [CH] Switzerland .......................... 1492/83

[51] Int. Cl.$^4$ .............................................. H03F 3/45
[52] U.S. Cl. ..................................... 330/261; 330/253; 330/300
[58] Field of Search ............... 330/258, 260, 261, 307, 330/253, 300

[56] References Cited

U.S. PATENT DOCUMENTS 4,213,098  7/1980  Tsividis .......................... 330/258 X Primary Examiner—Eugene R. LaRoche
Assistant Examiner—Steven J. Mottola
Attorney, Agent, or Firm—Parkhurst & Oliff

[57] ABSTRACT

There is disclosed a differential amplifier which comprises bipolar transistors which may be produced using MOS technology and wherein the amplifier is particularly useful when the transistors have a poorly defined current gain. The amplifier includes a first pair of transistors having emitters connected in common and having bases forming the inputs to the differential amplifier. A second pair of transistors identical to the first pair are coupled such that the emitters and bases of said second pair are connected respectively to the emitters and bases of the first pair. The collectors of the second pair of transistors are connected to a current generator and to the input of a transconductance amplifier such that the transconductance amplifier causes the sum of the emitter currents of the first and second pairs of transistors to be controlled by the current supplied by the current generator.

7 Claims, 10 Drawing Figures

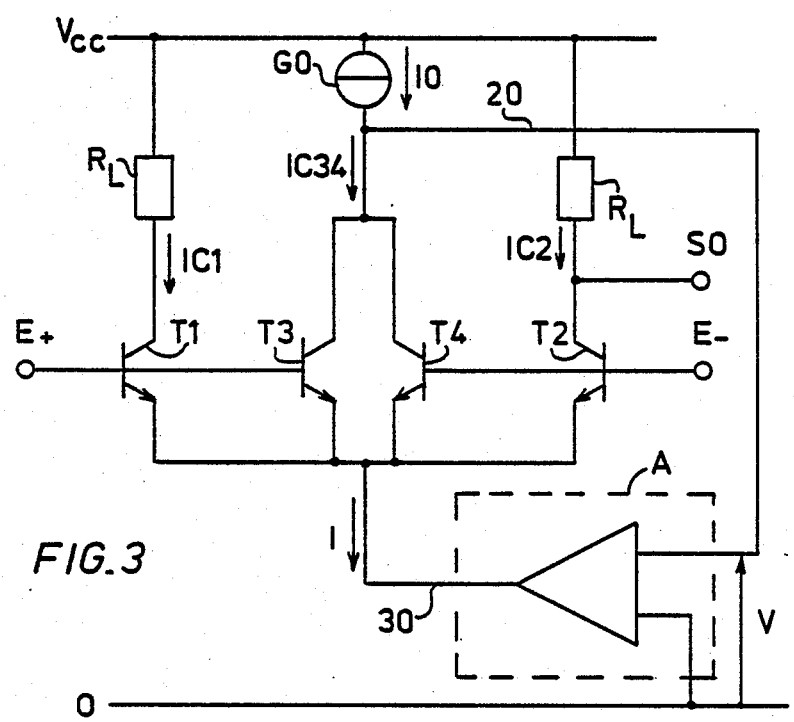
FIG.3
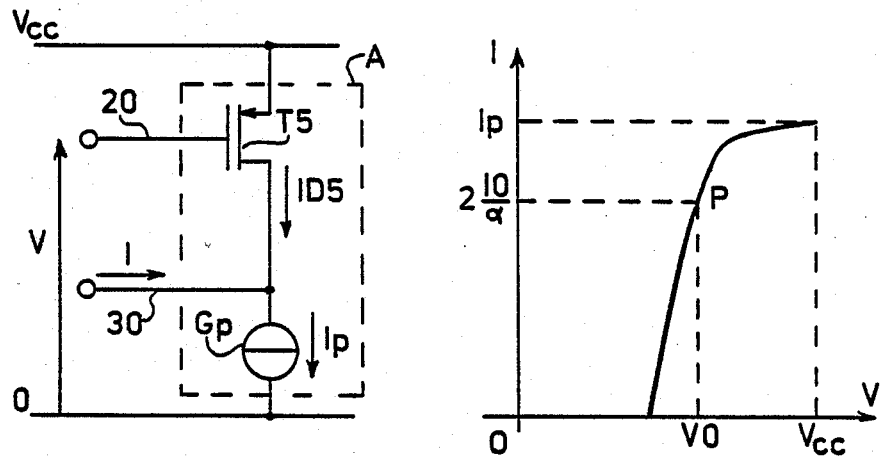
FIG.4.a     FIG.4.b

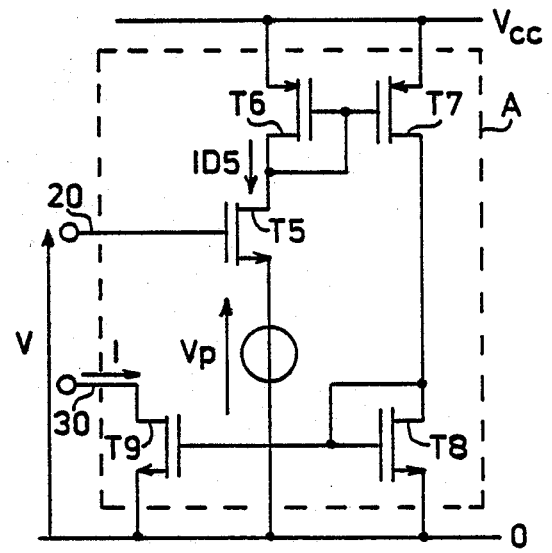
FIG.5_a
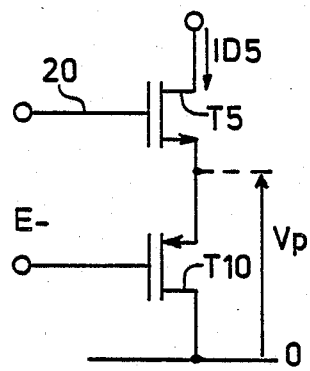
FIG_6
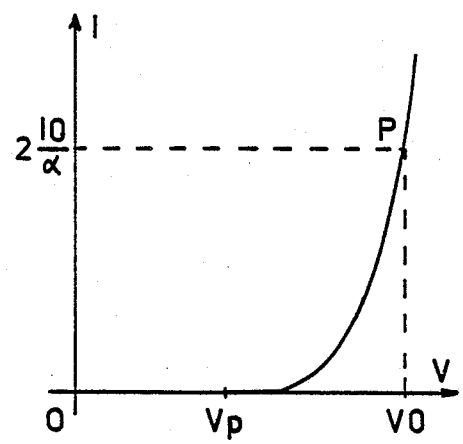
FIG.5_b

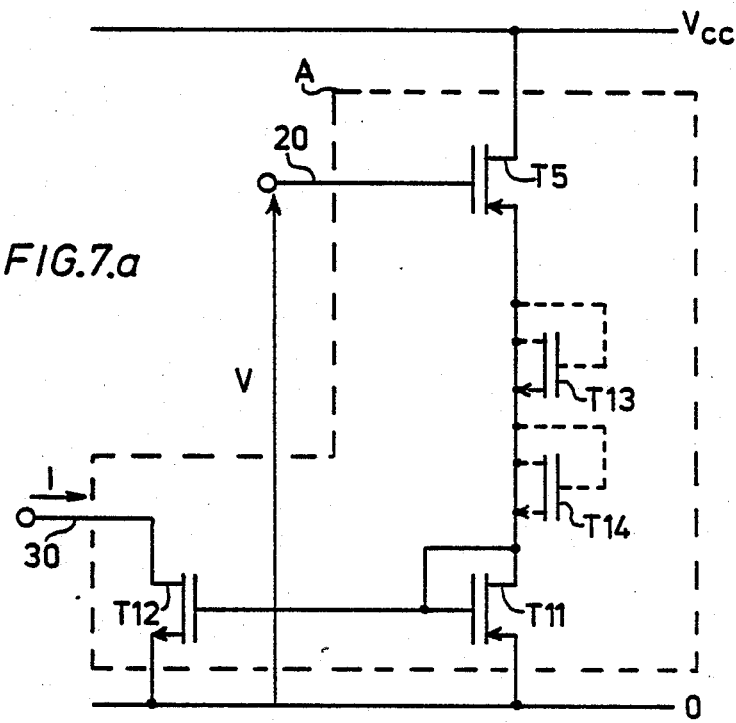
FIG.7.a
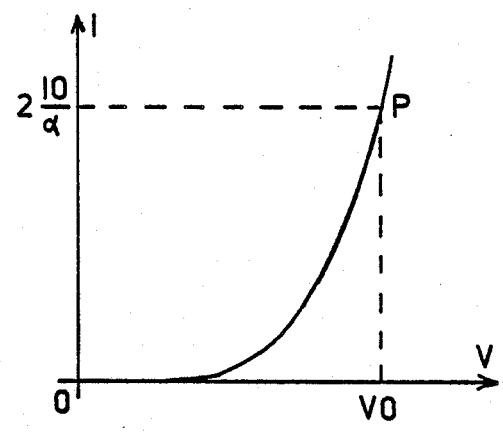
FIG.7.b

DIFFERENTIAL AMPLIFIER WITH BIPOLAR TRANSISTORS WHICH IS COMPATIBLE WITH STANDARD COMPLIMENTARY MOS (CMOS) TECHNOLOGY

BACKGROUND OF THE INVENTION

The present invention relates to differential amplifiers and more particularly to differential amplifiers constructed using transistors having bipolar operating characteristics so that the differential amplifier is compatible with standard complementary MOS (CMOS) technology.

In the present development of integrated electronic circuits, there is increasing interest in the possibility of obtaining analog functions and digital functions on the same circuit. Although bipolar technologies are known to be better for purely analog circuits, MOS technologies are preferred for the implementation of the digital part of a circuit. While many attempts have been made to combine the advantages of both bipolar and MOS technologies, the same involve either the modification of existing manufacturing processes or the production of devices with very limited applications.

By way of example, such processes which are modified to permit the integration of bipolar and MOS devices are described in the article entitled "CMOS and Complementary Isolated Bipolar Transistor Monolithic Integration Process" by M. Darwish and R. Taubenest in the *Journal of the Electrochemical Society*, Volume 121, No. 8, August 1974, and the article entitled "Bimos Micropower IC's" by Otto H. Shade, Jr. in the *IEEE Journal of Solid-State Circuits*, Volume SC-13, No. 6, December 1978. The modifications described in those articles consist of supplementary stages of manufacture which increase costs and reduce the yields of the circuits produced by such processes.

There has also been proposed the production of bipolar devices with MOS technology as particularly described in the article entitled "A CMOS Voltage Reference" by Yannis P. Tsividis et al. in the *IEEE Journal of Solid-State Circuits*, Volume SC-13, No. 6, December 1978, and the article entitled "A Low-Voltage CMOS Band-Gap Reference" by Eric A. Vittoz et al in the same *IEEE Journal of Solid-State Circuits*, Volume SC-14, No. 3, June 1979. Such bipolar devices as are described in the above articles are often called a "MOS substrate transistor" and is more particularly shown in FIG. 1 of the drawings. As will be appreciated, the applications of such devices are limited.

There are still other known examples of devices wholly compatible with standard MOS technolgy that have the characteristics of a bipolar transistor without having the limitations of the MOS substrate transistor of FIG. 1. Such an example is shown in FIG. 2, as will be described in greater detail below. Such devices as are shown in FIG. 2 define a bipolar transistor with a current gain $\alpha$ which will always be lower than unity, but with a current gain $\beta$ which may attain quite high values thereby making the device perfectly usable in practice. However, although such devices may be used satisfactory in certain applications instead of conventional bipolar transistors, there are other applications in which the low and poorly controlled value of the $\alpha$ current gain prevents the use of conventional layouts of bipolar circuits.

By way of example, this is particularly the case when it is desired to implement an integrated differential amplifier with the aid of such devices. In such instances, it is to be understood that the differential amplifier is defined to be a circuit having a pair (differential pair) of transistors having emitters connected to a current source and collector currents defined by the signals applied to the bases of the transistors. In some instances, such circuits are currently used to amplify the difference between two signals, in which case the output quantity is a voltage. In other instances, the circuits are used to achieve a "current switching" in which case the output quantity can be a current.

Accordingly, the present invention has been developed to provide an improved differential amplifier which can be produced using transistors having bipolar operating characteristics and compatible with standard CMOS technology.

SUMMARY OF THE INVENTION

In accordance with the present invention, there is disclosed a differential amplifier comprising a first pair of transistors having bipolar operating characteristics wherein the emitters of the first pair of transistors are coupled to one another, and the collectors of the first pair are connected to load elements and wherein at least one of the bases of the first pair of transistors constitutes an input of the differential amplifier. The differential amplifier includes a second pair of transistors which are identical to the first pair of transistors and wherein the emitters of the second pair of transistors are connected to the emitters of the first pair of transistors. Each of the bases of the second pair of transistors are connected to a respective one of the bases of the first pair of transistors while the collectors (collector circuits) of the second pair of transistors are coupled to and supplied by a first current source. The differential amplifier includes a control circuit coupled between the collectors of the second pair of transistors and the point of common coupliing between the emitters of the first and second pair of transistors. The control circuit is constructed and arranged to operate so as to maintain the sum of the collector currents of the first pair of transistors equal to the current supplied by the first current source to the collectors of the second pair of transistors.

It is therefore an object of the invention to provide a differential amplifier which can be produced using bipolar devices having a low and poorly defined $\alpha$ current gain.

It is still another object of the invention to provide a differential amplifier which is wholly compatible with standard CMOS technology.

These and other objects, advantages and novel features of the invention will become apparent from the following detailed description of the invention when considered in connection with the accompanying drawings wherein:

BRIEF DESCRIPTION OF THE DRAWINGS

FIG. 3 is a schematic diagram showing a differential amplifier in accordance with the present invention;

FIG. 4a illustrates an embodiment of the amplifier A shown in FIG. 3;

FIG. 4b is a characteristic curve of the circuit shown in FIG. 4a;

FIG. 5a illustrates another embodiment of the amplifier A shown in FIG. 3;

FIG. 5b is a characteristic curve of the circuit shown in FIG. 5a;

FIG. 6 illustrates a variation of the circuit shown in FIG. 5a;

FIG. 7a illustrates another embodiment of the amplifier A shown in FIG. 3; and

FIG. 7b is a characteristic curve of the circuit shown in FIG. 7a.

DETAILED DESCRIPTION OF PREFERRED EMBODIMENTS

Figure 1:
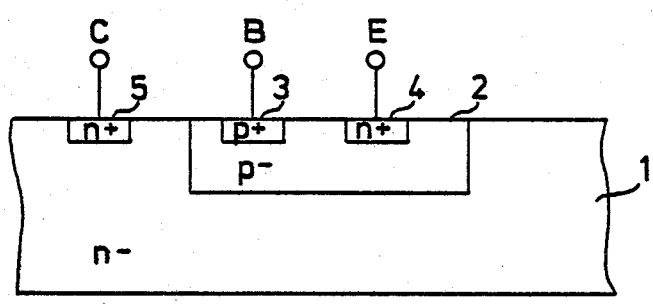
FIG. 1 is a diagram showing a known bipolar MOS substrate transistor.

As was previously described, there is shown in FIG. 1 bipolar devices which can be produced with MOS technology. These devices are typically called "MOS substrate transistors" and as described in the aforementioned articles, include a substrate 1 of n-type having a p-type well 2 formed therein. An n+ diffusion zone 4 formed in the p-well 2 is connected to an electrode E serving as an emitter, while a p+ zone 3 formed in the well 2 is connected to a base electrode B. An n+ zone 5 is also formed in the n− substrate 1 and is connected to a collector electrode C. By difinition, the bipolar transistor thus formed, as shown in FIG. 1, has its collector C at the potential of the substrate 1 and the latter is connected to the positive voltage of the supply source. Again, as was previously mentioned, it will be apparent that the application of such devices are limited.

Figure 2:
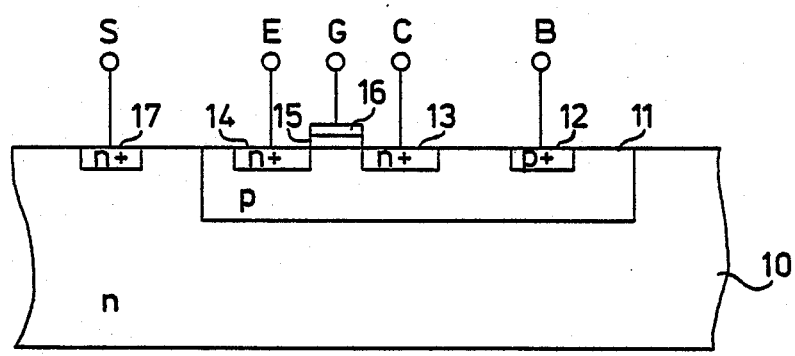
FIG. 2 is a diagram showing another bipolar transistor produced with the aid of MOS-type technology.

Referring now to FIG. 2, there is shown another example of a device wholly compatible with standard MOS technology and having the characteristics of a bipolar transistor without the limitations of the MOS substrate transistor of FIG. 1. In this example, a well 11 of p-type is formed (e.g. by diffusion) in a substrate 10 of n-type. The p-well 11 is connected through a diffusion zone 12 of p+-type to a base electrode B, while two diffusion zones 13 and 14 of n+-type are connected respectively two a collector electrode C and to an emitter electrode E. A gate 16 of metal or doped polycrystalline silicon is deposited on a insulating oxide 15 over the space between the two diffusion zones 13 and 14 and connected to a gate electrode G. The substrate 10 is connected to an electrode S through a diffusion zone 17 of n+-type.

The structure of FIG. 2 differs from that described in FIG. 1 in that the transistor formed in the manner shown in FIG. 2 has a lateral structure. Thus, the gate electrode G is brought to a potential sufficiently negative to avoid inversion of the conductivity type of the zone situated between the diffusion zones 13 and 14. It should be understood that it is possible to omit the gate 16 as long as the formation of a channel in the zone situated between the diffusion 13 and 14 can be prevented. This may be accomplished, for example, by implanting p-type impurities in the zone between the diffusions 13 and 14.

The p-n junction between the well 11 and substrate 10 is coupled so that it is biased in the reverse direction. Thus, when the n+-p emitter junction is biased in the forward direction, electrons are emitted into the well 11 (connected to the base electrode B) and part of the current is collected by the collector C (the n+-p collector junction being biased in the reverse direction). As a result, it is possible to define for this example of a bipolar transistor, an α current gain where $\alpha = -I_C/I_E$, and where $I_E$ and $I_C$ represent, respectively, the emitter and collector currents. In the present example, α will always be lower than unity, but the β current gain, where $\beta = I_C/I_B$ and $I_B$ represents the base current, may attain quite high values thereby rendering the device perfectly usable in practice.

Although the above-mentioned device of FIG. 2 can be satisfactorily used int he place of conventional bipolar transistors in certain applications, there are other applications in which the low and poorly controlled value of its α current gain prevents the use of conventional layouts of bipolar circuits as was previously mentioned. This is particularly true in the implementation of integrated differential amplifiers using such devices.

In accordance with the present invention, there is shown in FIG. 3 a differential amplifier which includes a conventional pair of bipolar transistors T1 and T2 of n-p-n type having their emitters connected commonly to one another, their collectors connected through loads $R_L$ to a terminal $V_{cc}$ of a differential amplifier supply voltage source and their bases constituting the input terminals E+ and E−. The collector of the transistor T2 is connected to provide an output at the terminal SO.

In circuits produced in conventional bipolar technology, the sum of the emitter currents is fixed by a current source which is connected in series with the emitters of transsistors T1 and T2. Since the α current gain of the transistors T1 and T2 is very close to unity, the sum of the collector currents of those same transistors is likewise constant and well defined. Alternatively, in the case of bipolar transistors produced in MOS technology, such as the transistor of the type shown in FIG. 2, the α current gain is not only appreciably smaller than unity, but is not defined from one wafer to another. It is therefore not possible in the instance of using a transistor of the type shown in FIG. 2, to utilize the same principle of biasing as in conventional circuits.

As a result, in accordance with the present invention, there is shown the use of a second pair of transistors T3 and T4, which are identical to the first pair of transistors T1 and T2, wherein the base and emitter electrodes are connected to the corresponding electrodes of the transistors T1 and T2. In the example shown in FIG. 3, the base of transistor T3 is connected to the base of transistor T1 while the base of transistor T4 is connected to the base of transistor T2.

Referring still to FIG. 3, the collectors of transistors T3 and T4 are connected in common to one another and are coupled to be supplied by a current source GO which delivers a current IO. The point of common connection of the collectors of transistors T3 and T4 is further connected via an electrical connection 20 to the input of a transconductance amplifier A. Amplifier A delivers at its output a current I which varies in such a manner that it increases with the voltage V applied at its input. The output current I of the amplifier A represents the sum of the emitter currents of the transistors T1, T2, T3 and T4 flowing on the electrical connection 30.

In accordance with the circuit of FIG. 3, if the same is suitably proportioned and if the collector-emitter voltage of the transistors T1, T2, T3 and T4 is higher than a few tenths of a volt, the circuit has a point of equilibrium P for which IC1+IC2=IC34=IO, which corresponds to I=2(IO/α). At this poit of equilibrium, the voltage V at the input of the amplifier A takes the value VO which must be such that the collector-emitter voltage of transistors T3 and T4 is higher than a few tenths of a volt.

It should be understood that although the transistors T1, T2, T3, and T4 of FIG. 3 are represented as conventional bipolar transistors, it is clear that the arrangement of FIG. 3 is more particularly applicable to the use of transistors having an α current gain which is poorly defined, such as transistors of the type shown in FIG. 2. If such transistors as are shown in FIG. 2 are employed, they comprise a gate electrode (terminal G of FIG. 2) and an electrode connected to the substrate (terminal S of FIG. 2). In such instances, for each of the transistors T1, T2, T3 and T4, the gate electrode G must be brought to a potential sufficiently negative with respect to the emitter E so that there is no inversion of the conductivity type of the zone covered by the gate G. In practice, the gate electrode G can be connected to the negative supply terminal of the supply voltage source of the circuit (terminal O of FIG. 3). Also, the electrode connected to the substrate must be brought to a potential such that, for each of the transistors T1, T2, T3 and T4, the junction between the well 11 and the substrate 10 (FIG. 2) is biased in the reverse direction.

Again, in practice the substrate 10 will be connected to the positive supply terminal $V_{cc}$ of the supply voltage source of the circuit as shown in FIG. 3. Likewise, the load resistors $R_L$ in series with the collectors of transistors T1 and T2 can be implemented with MOS transistors connected like diodes or by any other equivalent means. In particular, the load elements ($R_L$) may be formed by an active circuit supplying given currents to the collectors of the transistors T1 and T2. It should be specifically noted, that since the bases of the transistors of the same pair (T1 and T3 or T2 and T4) are connected, the transistors can be produced in the same well 11.

Referring now to FIG. 4a, there is shown an embodiment of the amplifier A of FIG. 3 wherein the characteristic curve is illustrated in FIG. 4b. The amplifier A of FIG. 4a comprises a p-channel MOS transistor T5 connected in series with a current source Gp between the supply terminals ($V_{cc}$ and O) of the voltage supply source of the circuit. The gate of transistor T5, which is connected to the collectors of the transistors T3 and T4 (FIG. 3) by the electrical connection 20, is brought to a potential V. The output current I of the amplifier appearing on the electrical connection 30 is such that I=Ip-ID5 where Ip is the current supplied by the current source Gp and ID5 is the drain current of the transistor T5.

Referring now to FIG. 4b, there is shown the variation of the output current I as a function of the input voltage V of the amplifier A. In accordance with FIG. 4a, if the current Ip is higher than $2(IO/\alpha)$, balance of the circuit is attained for a value of the output current equal to the value $2(IO/\alpha)$, for which there corresponds an input voltage V equal to VO. It is thus clear, that in order to fulfill the conditions relating to the value of the current Ip, it is possible to place the current Ip under the control of the current IO. This may be accomplished, for example, by means of current mirrors having a ratio greater than the maximum value of $2/\alpha$.

Referring now to FIG. 5a, there is illustrated another embodiment of the ampllifier A wherein the characteristic curve is illustrated in FIG. 5b. The amplifier A of FIG. 5a comprises an n-channel MOS transistor T5, the source of which is brought to a potential Vp with respect to the supply terminal O. The drain current ID5 of transistor T5 is transformed into an output current I by two current mirrors, wherein the first current mirror is formed by the p-channel MOS transistors T6 and T7 and the second current mirror is formed by the n-channel MOS transistors T8 and T9. In this embodiment, FIG. 5b shows the variation in the output current I of the amplifier A as a function of the voltage V of the gate of transistor T5. The point P with coordinates VO and $2(IO/\alpha)$ corresponds to the point of equilibrium of the circuit. The voltage Vp must be high enough to insure a collector-emitter voltage of transistors T3 and T4 greater than a few tenths of a volt.

Turning now to FIG. 6, there is shown an implementation wherein the source voltage of transistor T5 can be under the control of the level of the input voltage applied at the input terminal E- (FIG. 3) of the differential amplifier. The inplut terminal E- is connected to the gate of a p-channel MOS transistor T10 having its drain connected to the terminal O of the voltage supply source of the circuit and having its source connected to the source of transistor T5. The voltage Vp, with respect to the terminal O of the source of transistor T5, is thus under the control of the input voltage of the differential amplifier.

FIG. 7a shows still another embodiment of the amplifier A wherein the characteristic curve is shown in FIG. 7b. In this instance, the amplifier A of FIG. 7a comprises an n-channel MOS transistor T5 operating in common-drain mode and loaded by a current mirror formed by the transistors T11 and T12. The input voltage V of the gate of transistor T5 is equal to the sum of the gate-source voltages of the transistors T11 and T5 traversed by a current I/K, wherein K is the ratio of the currents of the current mirror formed by the transistors T11 and T12. The equilibrium voltage VO, for which the output current I is equal to $2(IO/\alpha)$, as shown in FIG. 7b, can be increased by coupling one or more elements between transistors T5 and T11 to cause a drop in voltage. Such added elements between transistors T5 and T11 may be, for example, the transistors T13 and T14 connected like diodes and represented in broken lines in FIG. 7a.

Although the present invention has been described with respect to the particular embodiments, it is nevertheless clear that the invention is not limited to the disclosed embodiments and that other modifications, variations, and improvements may be made within the scope of the appended claims. It is thus clear, for example, that the present invention applies equally to MOS technology using a substrate of p-type and a well of n-type. Furthermore, although the different embodiments have been described in connection with the use of a particular bipolar device as shown in FIG. 2, it will be readily understood that the present invention applies generally to any bipolar device, especially when the current gain is low and poorly controlled.

Obviously many other modifications and variations of the present invention are possible in light of the above teachings. It is therefore to be understood that within the scope of the appended claims, the invention may be practiced otherwise than as specifically described.

I claim:
1. A differential amplifier comprising:
a first pair of transistors constructed to have bipolar operating characteristics, each of the transistors of said first pair having an emitter, collector and base, and wherein said emitters of said first pair are connected in common to one another and said collectors are connected to respective load elements, at least one of said bases of said first pair of transistors forming a differential amplifier input;

a second pair of transistors identical to said first pair of transistors, each of the transistors of said second pair having a collector, emitter and base and wherein the emitters of said second pair of transistors are connected in common to the emitters of the first pair of transistors and the base of one of said transistors of said second pair is connected to the base of one of said transistors of said first pair and the base of the other of said transistors of said second pair is connected to the base of the other of said transistors of said first pair: said first and second pairs of transistors each having a MOS transistor structure produced in a substrate of a first conductivity type;

a well of a second conductivity type formed in said substrate;

a first and second zone of said first conductivity type formed in said well;

an insulated gate at least partially covering a zone of said well formed to separate said first and second zones, said first zone forming an emitter, said second zone forming a collector, and said well forming a base, respectively, of the MOS transistor, said gate and said substrate being biased in such a manner that the conductivity type of the zone under the gate is never inverted and a junction formed by the substrate and said well is always reverse biased;

means coupled to the collectors at a point of common coupling of the collectors of said second pair of transistors for providing a first source of current; and control circuit means coupled between the collectors of the second pair of transistors and the point of common coupling of the emitters of said first and second pair of transistors for maintaining the sum of the collector currents of the first pair of transistors equal to the current supplied by said first source of current.

2. The differential amplifier of claim 1 wherein said control circuit means comprises a transconductance amplifier having an input coupled to the common coupling of the collectors of said second pair of transistors to produce a voltage at said input, and wherein said transconductance amplifier is constructed to provide a current which increases with an increase in the voltage at said input.

3. The differential amplifier of claim 2, further including a differential amplifier supply source having first and second terminals and wherein said transconductance amplifier comprises a first MOS transistor having a gate, source and drain, said gate being connected to the point of common connection of the collectors of said second pair of transistors, said source being connected to the first terminal of said differential amplifier supply source, and said drain being connected to the point of common coupling of the emitters of the first and second pairs of transistors, and means for providing a second source of current connected between the drain of said first MOS transistor and said second terminal of said differential amplifier supply source such that the current supplied by the means for providing a second source of current is greater than $2(IO/\alpha)$ where IO is the current supplied by the means for providing the first source of current and $\alpha$ is the ratio of the collector current to the emitter current of the transistors of the first and second pairs.

4. The differential amplifier of claim 2, wherein the transconductance amplifier comprises a first MOS transistor having a gate, source and drain, said gate being connected to the point of common coupling of the collectors of said second pair of transistors, said source being connected to a voltage source, and said drain being connected across two current mirrors to the point of common coupling of the emitters of the first and second pairs of transistors.

5. The differential amplifier of claim 4, wherein said voltage source comprises a second MOS transistor having a gate, source and drain and a conductivity type opposite to that of said first MOS transistor, said source of said second MOS transistor being connected to the source of said first MOS transistor, said drain of said second MOS transistor being connected to a terminal of said differential amplifier supply source, and said gate of said second MOS transistor being connected to the base of one of the transistors of said first pair of transistors.

6. The differential amplifier of claim 2, wherein the transconductance amplifier comprises a first MOS transistor having a gate, drain and source, said gate being connected to the point of common coupling of the collectors of the second pair of transistors, said drain being connected to a terminal of said differential amplifier supply source, and said source being connected to the point of common coupling of the emitters of said first and second pairs of transistors through a current mirror.

7. The differential amplifier of claim 6, further including at least one element coupled between said source of said first MOS transistor and said current mirror for producing a voltage drop.

* * * * *